(12) United States Patent
Nakazawa et al.

(10) Patent No.: US 11,905,603 B2
(45) Date of Patent: Feb. 20, 2024

(54) SUBSTRATE PROCESSING METHOD AND SUBSTRATE PROCESSING APPARATUS

(71) Applicant: Tokyo Electron Limited, Tokyo (JP)

(72) Inventors: Takashi Nakazawa, Kumamoto (JP); Isamu Miyamoto, Kumamoto (JP); Keigo Satake, Kumamoto (JP); Kenji Nakamizo, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/553,971

(22) Filed: Dec. 17, 2021

(65) Prior Publication Data

US 2022/0195609 A1    Jun. 23, 2022

(30) Foreign Application Priority Data

Dec. 22, 2020   (JP) .................................. 2020-212872

(51) Int. Cl.
*C23F 1/26*   (2006.01)
*C23F 1/08*   (2006.01)

(52) U.S. Cl.
CPC . *C23F 1/26* (2013.01); *C23F 1/08* (2013.01)

(58) Field of Classification Search
None
See application file for complete search history.

(56) References Cited

U.S. PATENT DOCUMENTS

| | | | | |
|---|---|---|---|---|
| 8,394,228 | B2 * | 3/2013 | Christenson | G03F 7/423 156/345.55 |
| 2007/0257011 | A1 * | 11/2007 | Siefering | H01L 21/67086 216/99 |
| 2011/0277793 | A1 * | 11/2011 | Inada | H01L 21/67017 134/18 |
| 2012/0125368 | A1 * | 5/2012 | Kaneko | H01L 21/67086 134/36 |
| 2013/0223180 | A1 * | 8/2013 | Komiya | B01F 35/71 366/132 |

(Continued)

FOREIGN PATENT DOCUMENTS

JP    2003-234307 A    8/2003
JP    2014236079 A  *  12/2014

(Continued)

*Primary Examiner* — Sylvia Macarthur
(74) *Attorney, Agent, or Firm* — Nath, Goldberg & Meyer; Jerald L. Meyer; Tanya E. Harkins

(57) ABSTRACT

A substrate processing apparatus includes: a mixer configured to mix sulfuric acid as a first component and a second component different from the first component to prepare an etchant; a nozzle configured to eject the etchant to a substrate; a first component supplier including a first flow path that supplies the first component to the mixer, a first instantaneous flowmeter and a first flow rate controller provided in the first flow path; a second component supplier including a second flow path different from the first flow path and configured to supply the second component to the mixer, a second instantaneous flowmeter and a second flow rate controller provided in the second flow path; and a controller configured to control the first and second flow rate controllers using average flow rates of the first component and the second component during the ejection of the etchant to the substrate.

9 Claims, 8 Drawing Sheets

(56) References Cited

U.S. PATENT DOCUMENTS

| | | | | |
|---|---|---|---|---|
| 2014/0014134 A1* | 1/2014 | Ogata | .................... | B08B 13/00 |
| | | | | 134/104.1 |
| 2014/0137892 A1* | 5/2014 | Brown | .................... | G03F 7/423 |
| | | | | 134/18 |
| 2016/0370796 A1* | 12/2016 | Musselman | ....... | H01L 21/67253 |
| 2018/0182638 A1* | 6/2018 | Kagawa | ............ | H01L 21/02057 |
| 2020/0321217 A1* | 10/2020 | Nakazawa | ........ | H01L 21/02043 |
| 2021/0210363 A1* | 7/2021 | Sakurai | ............ | H01L 21/67051 |
| 2022/0195609 A1* | 6/2022 | Nakazawa | .......... | H01L 21/6708 |
| 2023/0098105 A1* | 3/2023 | Inatomi | ............... | C23C 18/1676 |
| | | | | 427/443.1 |

FOREIGN PATENT DOCUMENTS

| | | | | |
|---|---|---|---|---|
| JP | 2016127243 | A | * | 7/2016 |
| KR | 1020100045663 | A | * | 5/2010 |
| KR | 1020150055561 | A | * | 5/2015 |
| KR | 1020200117886 | A | * | 10/2020 |

\* cited by examiner

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2020-212872, filed on Dec. 22, 2020, the entire contents of which are incorporated herein by reference.

TECHNICAL FIELD

The present disclosure relates to a substrate processing method and a substrate processing apparatus.

BACKGROUND

The etching method disclosed in Patent Document 1 includes forming a titanium nitride film on a substrate on which a component containing tungsten is formed, and subsequently, performing wet etching on the titanium nitride film such that a ratio of the titanium nitride film to the tungsten in etching rate is 5 or more.

PRIOR ART DOCUMENT

[Patent Document]
Patent Document 1: Japanese Laid-Open Patent Publication No. 2003-234307

SUMMARY

A substrate processing apparatus according to an aspect of the present disclosure includes: a mixer configured to mix sulfuric acid as a first component and a second component different from the first component to prepare an etchant; a nozzle connected to the mixer and configured to eject the etchant to a substrate; a first component supplier including a first flow path configured to supply the first component to the mixer, a first instantaneous flowmeter provided in the first flow path, and a first flow rate controller provided in the first flow path; a second component supplier including a second flow path different from the first flow path and configured to supply the second component to the mixer, a second instantaneous flowmeter provided in the second flow path, and a second flow rate controller provided in the second flow path; and a controller configured to control the first component supplier and the second component supplier, wherein the controller controls the first flow rate controller and the second flow rate controller using an average flow rate of the first component and an average flow rate of the second component during the ejection of the etchant to the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
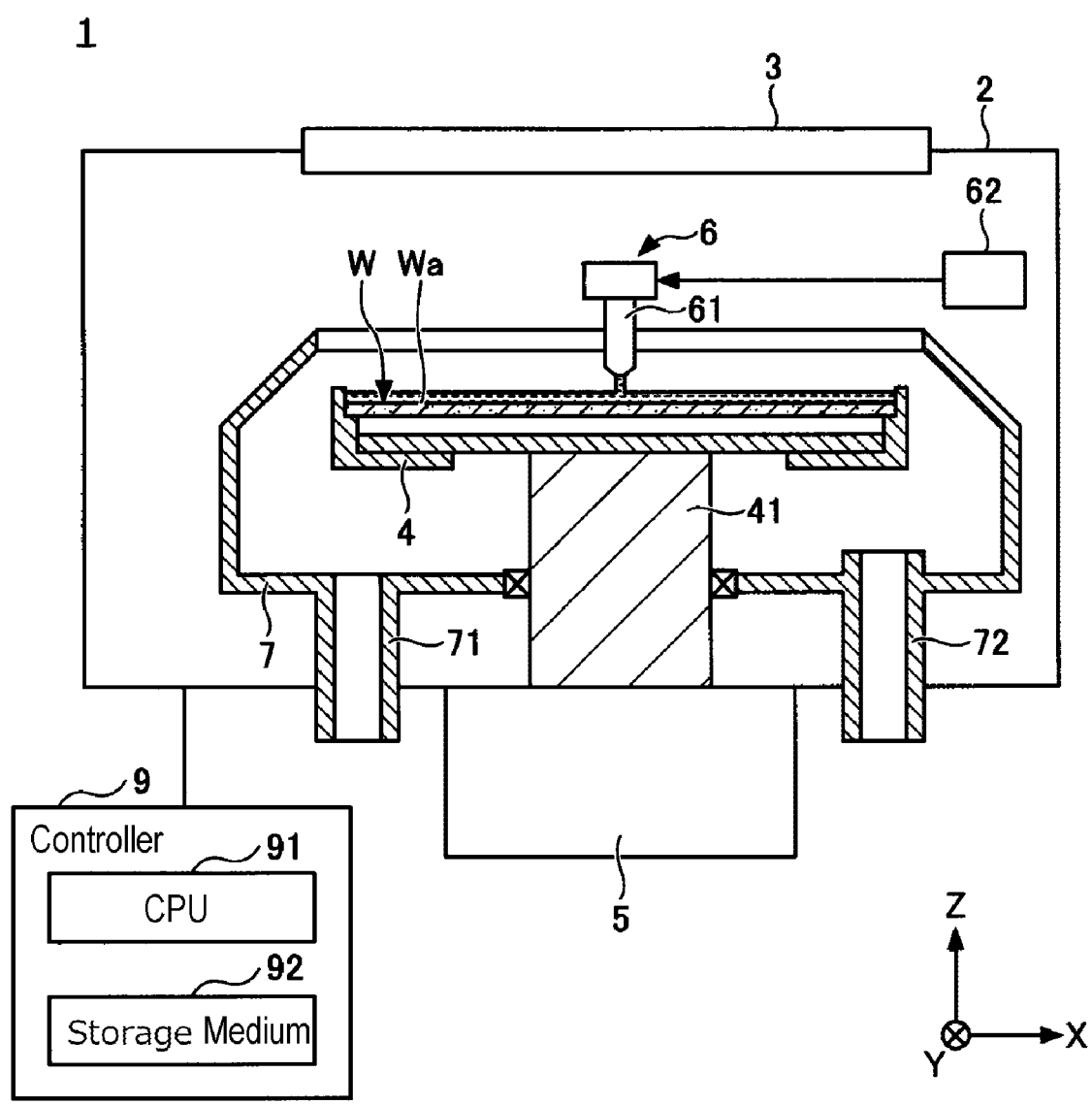
FIG. 1 is a cross-sectional view of a substrate processing apparatus according to an embodiment.

Hereinafter, embodiments of the present disclosure will be described with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In each drawing, the same or corresponding components will be denoted by the same reference numerals, and a description thereof is omitted. In the present specification, the X-axis direction, the Y-axis direction, and the Z-axis direction are perpendicular to each other. The X-axis direction and the Y-axis direction are horizontal directions, and the Z-axis direction is a vertical direction.

First, a substrate processing apparatus 1 according to the present embodiment will be described with reference to FIG. 1. The substrate processing apparatus 1 includes, for example, a processing container 2, a gas supply mechanism 3, a chuck 4, a chuck drive mechanism 5, a liquid supply mechanism 6, a recovery cup 7, and a controller 9. The processing container 2 accommodates a substrate W. The gas supply mechanism 3 supplies gas to the interior of the processing container 2. The chuck 4 holds the substrate W inside the processing container 2. The chuck drive mechanism 5 rotates the chuck 4. The liquid supply mechanism 6 supplies a processing liquid to the substrate W held by the chuck 4. The recovery cup 7 collects the processing liquid that is centrifugally dropped from the rotating substrate W. The controller 9 controls the gas supply mechanism 3, the chuck drive mechanism 5, and the liquid supply mechanism 6.

The chuck 4 holds the substrate W horizontally, for example, in the state in which a surface Wa of the substrate W is oriented upward. The surface Wa of the substrate W has a plurality of regions in which a plurality of films different from each other are exposed. One of the plurality of films is etched with an etchant. Combinations of the plurality of films are not particularly limited, but a combination of a TiN film and a W film is exemplified. In addition to the TiN film and the W film, a third film may be exposed from the surface Wa of the substrate W. In FIG. 1, the chuck 4 is a mechanical chuck, but may be a vacuum chuck, an electrostatic chuck, or the like.

The chuck drive mechanism 5 rotates the chuck 4. A rotation shaft 41 of the chuck 4 is arranged vertically. The chuck 4 holds the substrate W such that the center of the surface Wa of the substrate W and the rotational central line of the chuck 4 coincide with each other.

The liquid supply mechanism 6 includes a nozzle 61 that ejects the processing liquid. The nozzle 61 ejects the processing liquid from above with respect to the substrate W held by the chuck 4. The processing liquid is supplied to the radial center of the rotating substrate W and spreads over the entire surface of the substrate W in the radial direction by virtue of centrifugal force to form a liquid film. The number of nozzles 61 is one or more. A plurality of nozzles 61 may eject a plurality of types of processing liquids, or a single nozzle 61 may eject a plurality of types of processing liquids. As the plurality of types of processing liquids, for example, an etchant and a rinse liquid may be used.

The etchant is a mixed liquid of sulfuric acid, which is a first component, and hydrogen peroxide water, which is a second component. This mixture is also called sulfuric acid/hydrogen peroxide mixture (SPM). The SPM selectively etches the TiN film out of the TiN film and the W film. The sulfuric acid may be heated to a preset temperature. The hydrogen peroxide water may be at normal temperature.

Hydrogen peroxide water contains hydrogen peroxide and pure water. The pure water may be ultrapure water. The ultrapure water is water having a specific resistance value of 18 MΩ·cm or more. In addition, the hydrogen peroxide water may contain an additive such as an organic compound.

The second component may be pure water such as deionized water (DIW) instead of the hydrogen peroxide water. That is, the etchant may be a mixed liquid of sulfuric acid as the first component and pure water as the second component, or may be diluted sulfuric acid.

When the etchant is SPM, the etching rate (etching speed) of the TiN film is higher and the processing time is shorter compared to those in the case in which the etchant is the diluted sulfuric acid. When the etchant is the diluted sulfuric acid, the selectivity of the TiN film to the W film is higher than that in the case in which the etchant is SPM.

The rinse liquid is, for example, pure water. The liquid supply mechanism 6 supplies the rinse liquid to the substrate W after supplying the etchant to the substrate W. The etchant remaining on the substrate W can be replaced with the rinse liquid so that the etchant can be removed.

As will be described later, the liquid supply mechanism 6 includes, for each processing liquid, a flow path for supplying the processing liquid toward the nozzle 61. In addition, the liquid supply mechanism 6 includes an instantaneous flowmeter, a flow rate controller, and an opening/closing valve provided in the flow path. The instantaneous flowmeter measures an instantaneous flow rate. The flow rate controller controls the instantaneous flow rate. The opening/closing valve opens and closes the flow path.

The liquid supply mechanism 6 includes a nozzle driver 62 configured to move the nozzle 61. The nozzle driver 62 moves the nozzle 61 in the horizontal direction orthogonal to the rotational central line of the chuck 4. In addition, the nozzle driver 62 may move the nozzle 61 in the vertical direction. While the nozzle 61 is ejecting the liquid to the surface Wa of the substrate W, the nozzle driver 62 may move the nozzle 61 toward the surface Wa of the substrate W in the radial direction.

The recovery cup 7 accommodates the substrate W held by the chuck 4 and collects the liquid centrifugally dropped from the rotating substrate W. A drainage pipe 71 and an exhaust pipe 72 are provided in the bottom of the recovery cup 7. The drainage pipe 71 discharges the liquid accumulated inside the recovery cup 7. The exhaust pipe 72 discharges gas inside the recovery cup 7. The recovery cup 7 does not rotate together with the chuck 4, but may rotate together with the chuck 4.

The controller 9 is, for example, a computer, and includes a central processing unit (CPU) 91 and a non-transitory computer-readable storage medium 92 such as memory. The storage medium 92 stores a program for controlling various processes executed in the substrate processing apparatus 1. The controller 9 controls the operation of the substrate processing apparatus 1 by causing the CPU 91 to execute the program stored in the storage medium 92.

Figure 2:
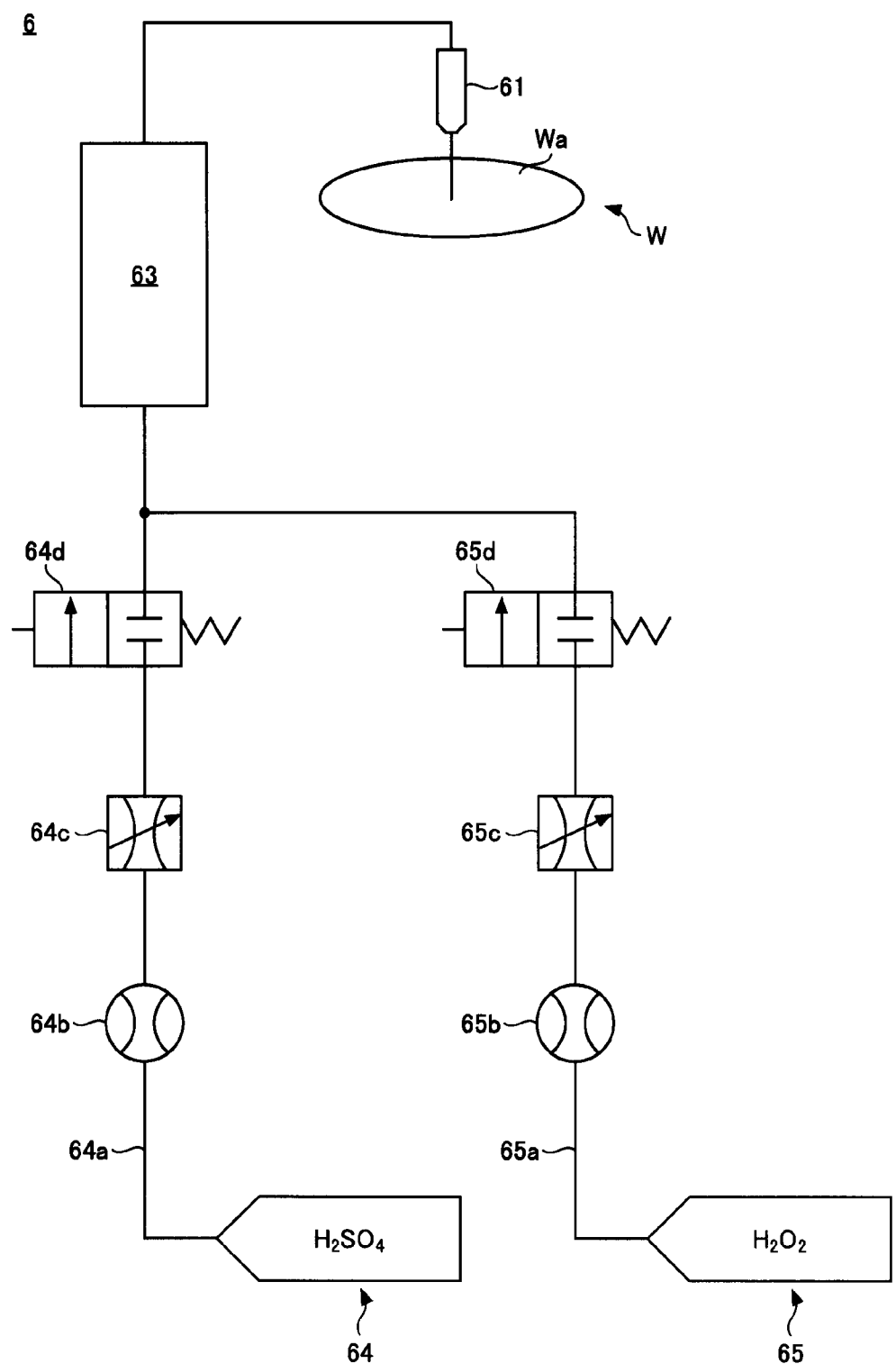
FIG. 2 is a view illustrating an example of a liquid supply mechanism.

Next, the liquid supply mechanism 6 according to the present embodiment will be described with reference to FIG. 2. In addition to the nozzle 61, the liquid supply mechanism 6 includes a mixer 63, a first component supplier 64, and a second component supplier 65. The mixer 63 mixes the sulfuric acid, which is the first component, with a second component different from the first component, to prepare an etchant. The first component supplier 64 supplies the first component to the mixer 63. The second component supplier 65 supplies the second component to the mixer 63.

The first component supplier 64 includes a first flow path 64a, a first instantaneous flowmeter 64b, a first flow rate controller 64c, and a first opening/closing valve 64d. The first flow path 64a supplies the first component to the mixer 63. The first instantaneous flowmeter 64b measures an instantaneous flow rate of the first component in the first flow path 64a. The measurement cycle is not particularly limited, but is, for example, about 0.1 second. The first flow rate controller 64c adjusts the instantaneous flow rate of the first component in the first flow path 64a. The first opening/closing valve 64d opens/closes the first flow path 64a.

When the first opening/closing valve 64d opens the first flow path 64a, the first component is supplied to the mixer 63 through the first flow path 64a. The instantaneous flow rate of the first component is controlled by the first flow rate controller 64c. When the first opening/closing valve 64d closes the first flow path 64a, the supply of the first component to the mixer 63 through the first flow path 64a is stopped.

The second component supplier 65 includes a second flow path 65a, a second instantaneous flowmeter 65b, a second flow rate controller 65c, and a second opening/closing valve 65d. The second flow path 65a supplies the second component to the mixer 63. The second instantaneous flowmeter 65b measures an instantaneous flow rate of the second component in the second flow path 65a. The measurement cycle is not particularly limited, but is, for example, about 0.1 second. The second flow rate controller 65c adjusts the instantaneous flow rate of the second component in the second flow path 65a. The second opening/closing valve 65d opens and closes the second flow path 65a.

When the second opening/closing valve 65d opens the second flow path 65a, the second flow path 65a supplies the second component to the mixer 63. The instantaneous flow rate of the second component is controlled by the second flow rate controller 65c. When the second opening/closing valve 65d closes the second flow path 65a, the second flow path 65a stops the supply of the second component to the mixer 63.

The mixer 63 mixes the first component supplied from the first component supplier 64 and the second component supplied from the second component supplier 65 to prepare an etchant. The mixing ratio of the first component and the second component and the flow rate ratio of the first component and the second component are equal. The mixer 63 is not particularly limited, but is, for example, a static mixer. In FIG. 2, the first flow path 64*a* and the second flow path 65*a* are joined at the upstream side of the mixer 63, but do not have to be joined. The first flow path 64*a* and the second flow path 65*a* may be separately connected to the mixer 63.

The average flow rate ratio A/B and respective average flow rates A and B of the first component and the second component are preset and stored as a portion of a recipe. The recipe is a set of control target values included in the program. A supply time T0 from the start of ejection of the etchant to the substrate W to the end of ejection is also set in advance and is stored as a portion of the recipe. The controller 9 controls the first component supplier 64 and the second component supplier 65 according to the recipe so that the etchant is ejected from the nozzle 61 to the substrate W.

Figure 3:
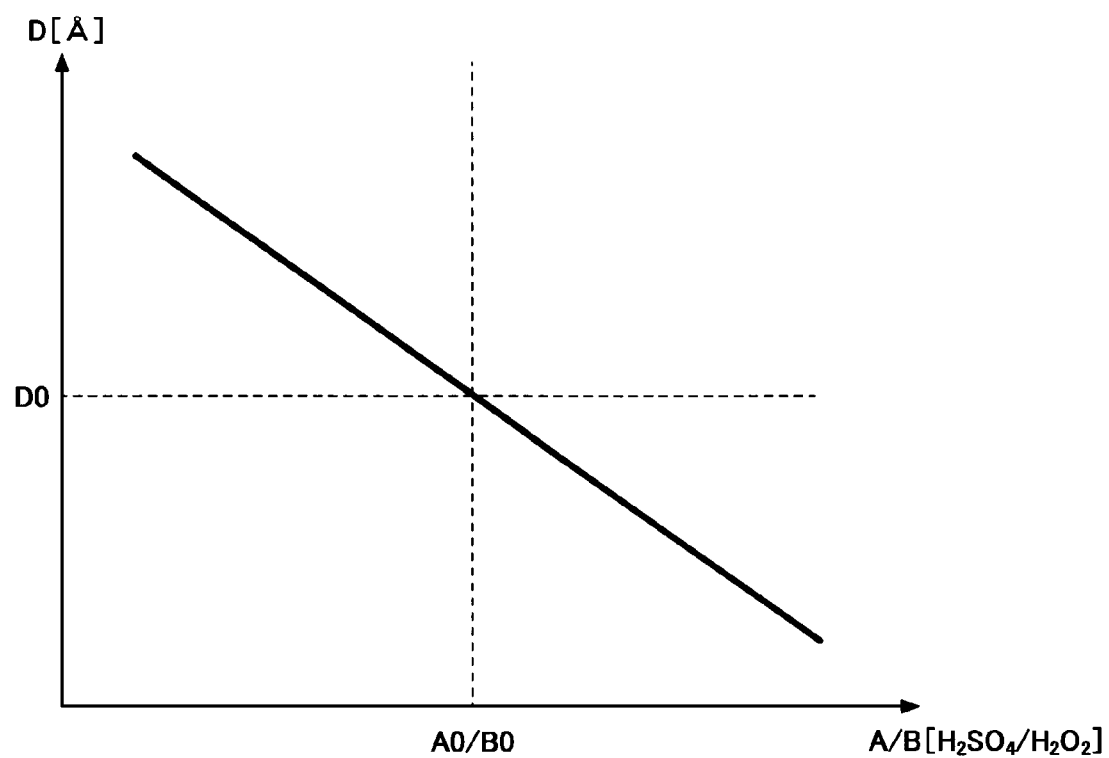
FIG. 3 is a diagram illustrating an example of an average flow rate ratio of a first component and a second component and a total etching amount.

Next, with reference to FIG. 3, a relationship between the average flow rate ratio A/B of the first component and the second component and the total etching amount D of the TiN film will be described. In FIG. 3, the average flow rate ratio A/B is an average flow rate ratio in the supply time T0. As described above, the supply time T0 is a time from the start of ejection of the etchant to the substrate W to the end of ejection, and is set in advance.

As illustrated in FIG. 3, the relationship between the average flow rate ratio A/B of the first component and the second component and the total etching amount D is approximated by a linear equation. This suggests that a relationship between the instantaneous flow rate ratio of the first component and the second component and the etching rate is approximated by a linear equation.

The larger the average flow rate ratio A/B of the first component and the second component, that is, the larger the ratio of the sulfuric acid compared to the ratio of the hydrogen peroxide water, the higher the etching rate and the larger the total etching amount D. This holds true when pure water is used instead of the hydrogen peroxide water.

The target values A0/B0 of the average flow rate ratio A/B and the target values A0 and B0 of respective average flow rates A and B are set such that the actual value of the total etching amount D becomes the target value D0, and are stored as a portion of the recipe In the related art, the controller 9 feedback-controls the first flow rate controller 64*c* based on a deviation between the measured value of the first instantaneous flowmeter 64*b* and the target value A0 during the ejection of the etchant to the substrate W. What is managed through the feedback control in the related art is the instantaneous flow rate of the first component, not the average flow rate.

Similarly, in the related art, the controller 9 feedback-controls the second flow rate controller 65*c* based on a deviation between the measured value of the second instantaneous flowmeter 65*b* and the target value B0 during the ejection of the etchant to the substrate W. What is managed through the feedback control in the related art is the instantaneous flow rate of the second component, not the average flow rate.

In the related art, the deviations between the measured values of the instantaneous flow rates and the target values have been accumulated, and thus the deviation between the actual value and the target value A0/B0 of the average flow rate ratio A/B may become large. As a result, an error between the actual value and the target value D0 of the total etching amount D may become large.

Figure 6:
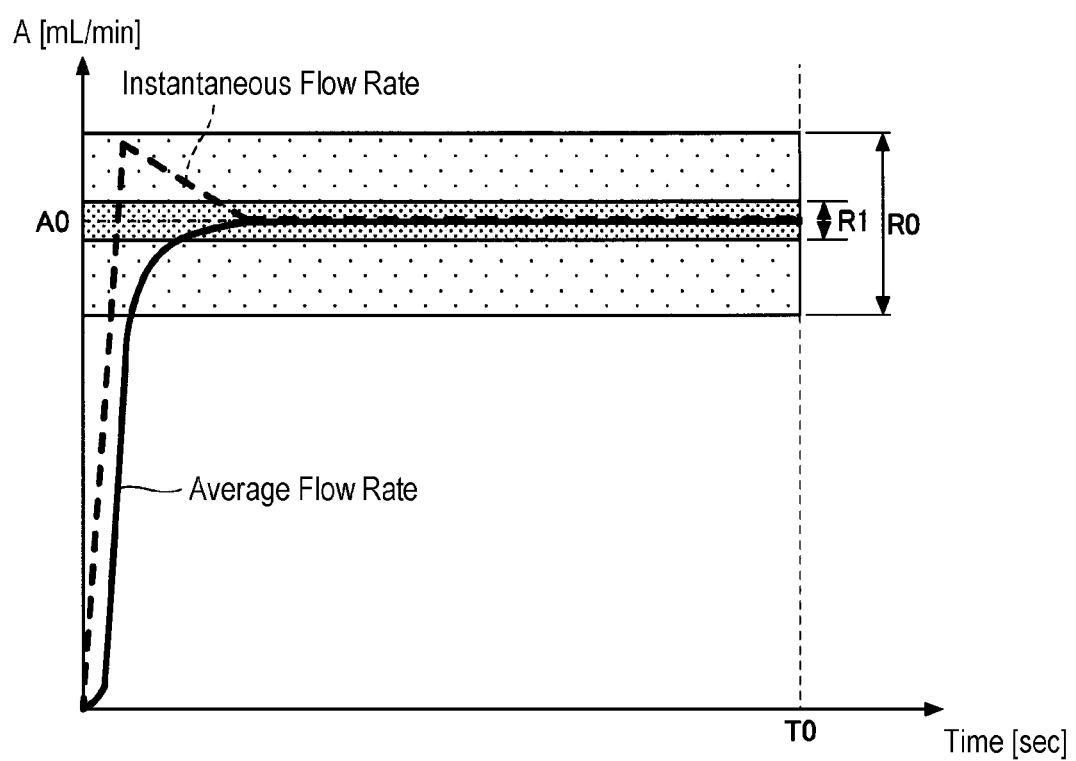
FIG. 6 is a diagram illustrating an example of overshoot of an instantaneous flow rate.
Figure 7:
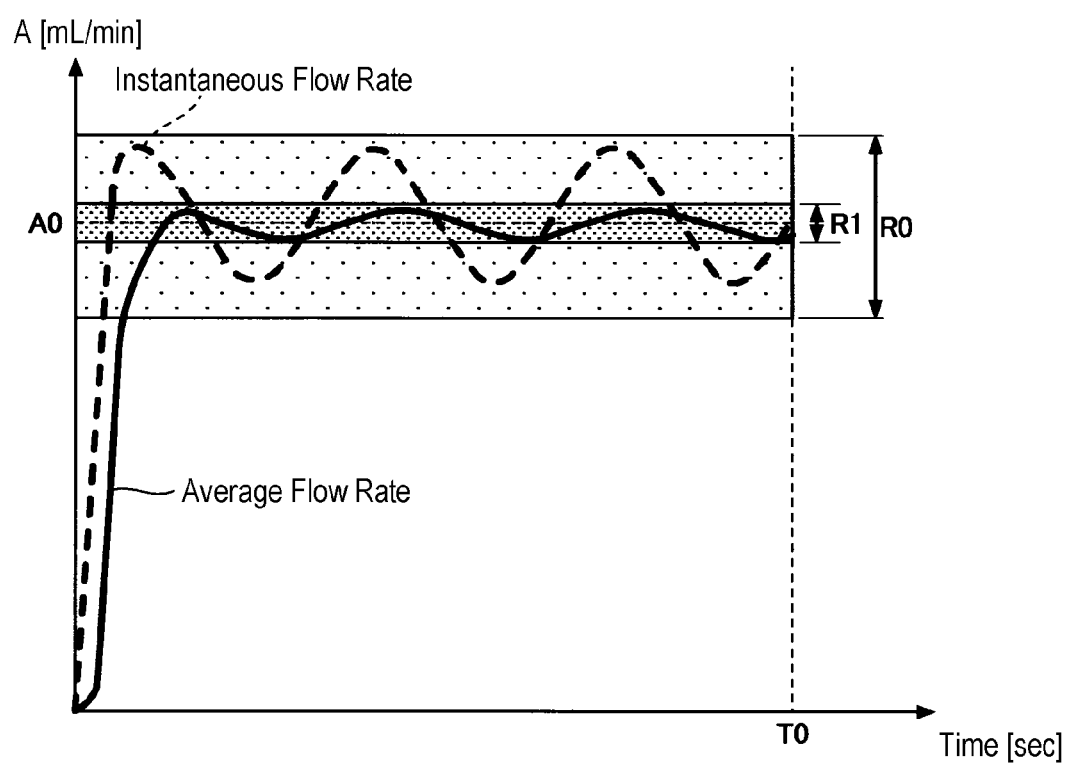
FIG. 7 is a diagram illustrating an example of hunting of an instantaneous flow rate.
Figure 8:
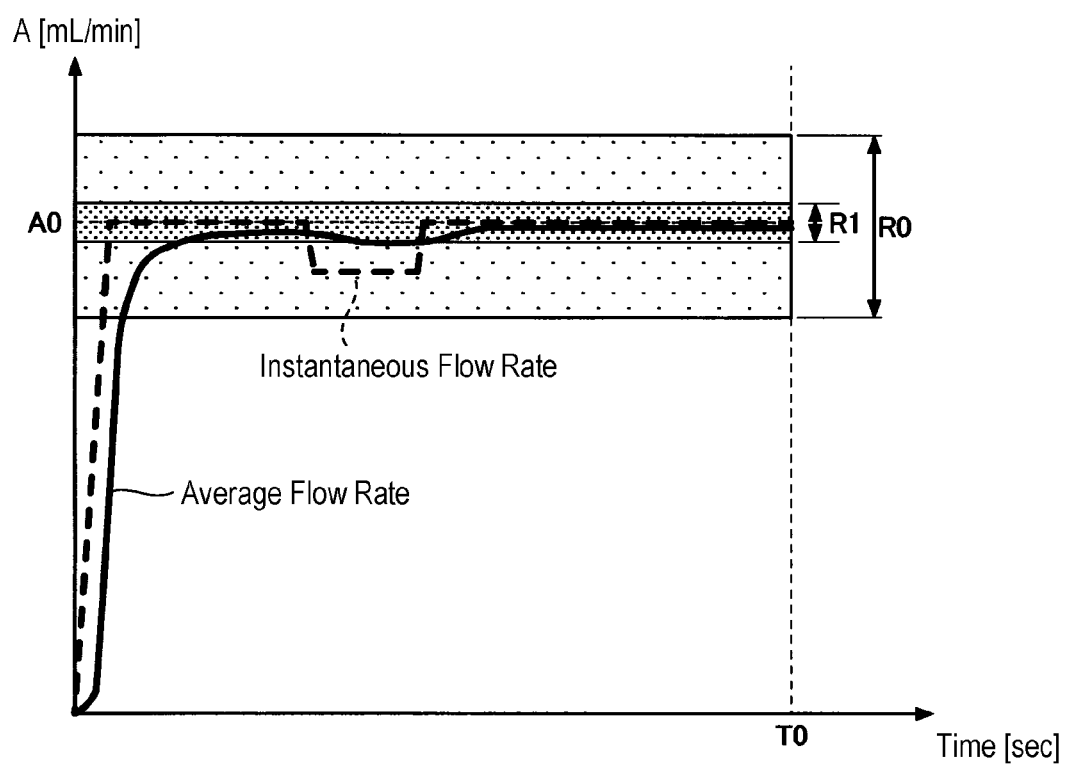
FIG. 8 is a diagram illustrating an example of a temporary decrease in an instantaneous flow rate.

The error between D and D0 is caused by fluctuations in instantaneous flow rate. The fluctuations in instantaneous flow rate include overshoot (see the dashed line in FIG. 6), undershoot, hunting (see the dashed line in FIG. 7), or temporary drop (see the dashed line in FIG. 8). The hunting in instantaneous flow is mainly caused by the pulsation of a pump. The pump is not particularly limited, but is, for example, a bellows pump. In addition, the temporary drop in the instantaneous flow rate is mainly caused when a plurality of substrate processing apparatuses 1 eject an etchant to substrates W in a simultaneous manner, resulting in a pressure loss.

The error between D and D0 also occurs when the instantaneous flow rate falls below the target value at the time of start-up. The error between the instantaneous flow rate and the target value is the largest at the start of ejection. This is because the instantaneous flow rate is zero at the start of ejection. A time during which the instantaneous flow rate is from 10% to 90% of the target value, that is, the so-called rising time, is, for example, about 1 second.

The controller 9 of the present embodiment controls the first flow rate controller 64*c* and the second flow rate controller 65*c* using the average flow rate A of the first component and the average flow rate B of the second component during the ejection of the etchant to the substrate W. By using the average flow rates A and B instead of the instantaneous flow rate, the error between the actual value and the target value A0/B0 of the average flow rate ratio A/B can be reduced, and thus the error between the actual value and the target value D0 of the total etching amount D can be reduced.

Figure 4:
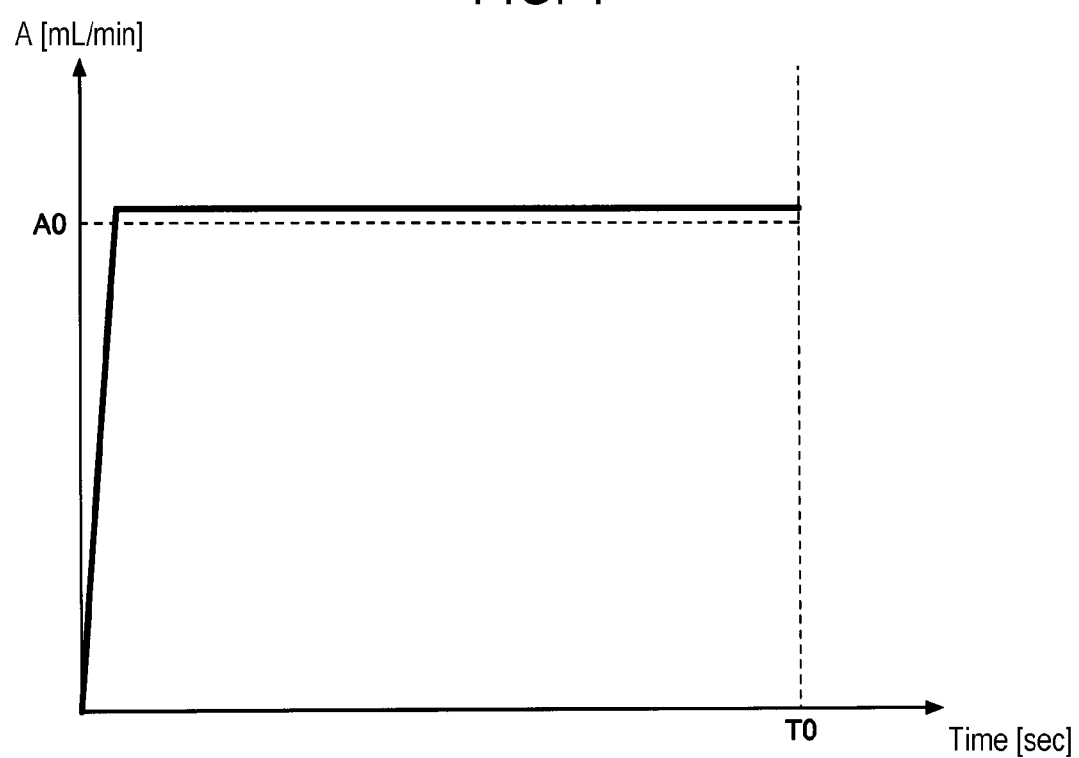
FIG. 4 is a diagram illustrating an example of a time-dependent change in an instantaneous flow rate when an average flow rate from the start of ejection to the end of ejection is controlled to be constant.
Figure 5:
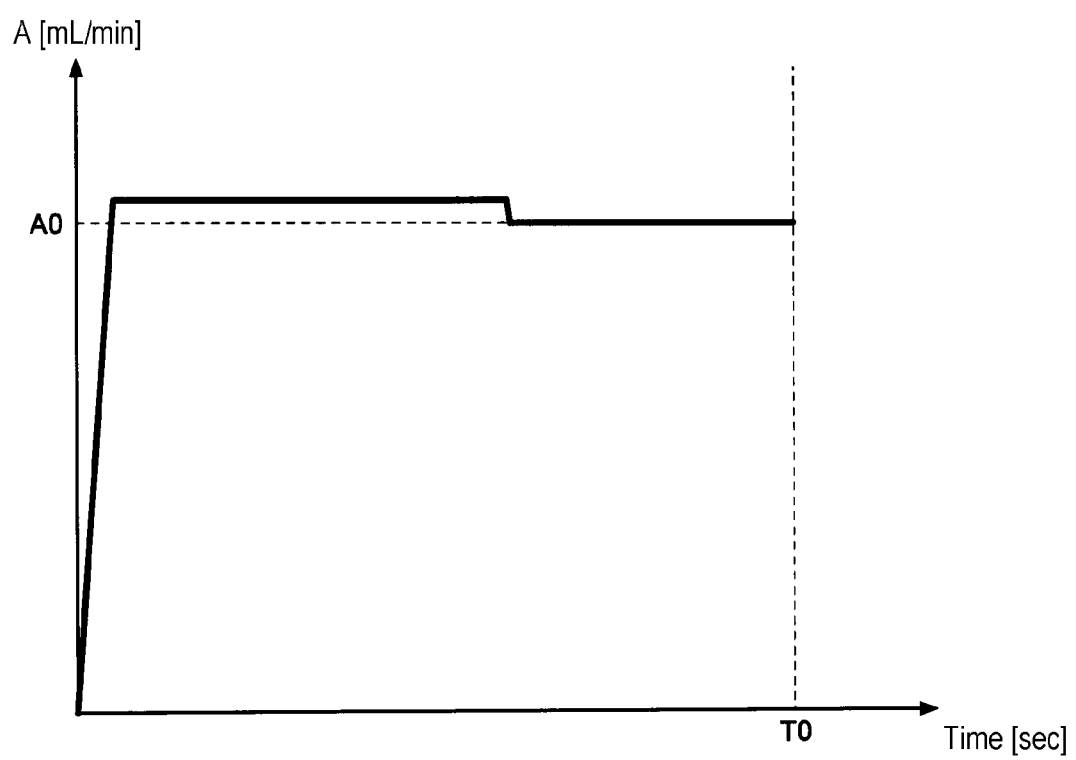
FIG. 5 is a diagram illustrating another example of a time-dependent change in an instantaneous flow rate when an average flow rate from the start of ejection to the end of ejection is controlled to be constant.

For example, the controller 9 controls the first flow rate controller 64*c* such that the average flow rate A of the first component in the supply time T0 matches the target value A0 during the ejection of the etchant to the substrate W. As illustrated in FIG. 3, the controller 9 controls the instantaneous flow rate of the first component to be higher than the target value A0 from halfway in order to compensate for the shortage of the instantaneous flow rate at the time of starting-up. As illustrated in FIG. 3, the controller 9 may control the instantaneous flow rate of the first component to be higher than the target value A0 until the end of ejection. Alternatively, as illustrated in FIG. 4, the controller 9 may control the instantaneous flow rate of the first component to be higher than the target value A0 until halfway. The controller 9 controls the first flow rate controller 64*c* such that the actual value of the total supply amount (mL) of the first component in the supply time T0 becomes the target value (A0×T0).

Similarly, the controller 9 controls the second flow rate controller 65*c* such that the average flow rate B of the second component in the supply time T0 matches the target value B0 during the ejection of the etchant to the substrate W. The controller 9 controls the instantaneous flow rate of the second component to be higher than the target value B0 from halfway in order to compensate for the shortage of the instantaneous flow rate at the time of starting-up. The controller 9 may control the instantaneous flow rate of the second component to be higher than the target value B0 until the end of ejection, or may control the instantaneous flow rate of the second component to be higher than the target value B0 until halfway. The controller 9 controls the second flow rate controller 65*c* such that the actual value of the total supply amount (mL) of the second component in the supply time T0 becomes the target value (B0×T0).

As described above, the controller 9 makes the total supply amount (mL) of each of the first component and the second component in the supply time T0 equal to the target value. As a result, the error between the actual value and the target value A0/B0 of the average flow ratio A/B in the supply time T0 can be reduced, and thus the error between the actual value and the target value D0 of the total etching amount can be reduced.

When the error between the actual value and the target value A0/B0 of the average flow rate ratio A/B in the supply time T0 is small, there is no problem even if the instantaneous flow rate of each component fluctuates. This is because the relationship between the instantaneous flow rate ratio of the first component and the second component and the etching rate is approximated by a linear equation, as is clear from FIG. 3.

The technique for controlling the average flow rate ratio A/B in the supply time T0 is applicable not only when the instantaneous flow rate falls below the target value at the time of starting-up, but also when the overshoot, undershoot, hunting, temporary drop, or the like in instantaneous flow rate occurs. In any case, it is sufficient if the error between the actual value and the target value A0/B0 of the average flow rate ratio A/B in the supply time T0 is small.

The controller 9 may control the first flow rate controller 64c and the second flow rate controller 65c such that the average flow rate ratio A/B of the first component and the second component per unit time t0 matches the preset target value A0/B0 during the ejection of the etchant to the substrate W. The unit time t0 is twice or more and 20 times or less the measurement cycle of the first instantaneous flowmeter 64b or the second instantaneous flowmeter 65b. The measurement cycle is, for example, about 0.1 second, and the unit time t0 is, for example, about 1 second. The unit time t0 is equal to or less than half of the supply time T0. The supply time T0 is not particularly limited, but is, for example, about 30 seconds.

For example, when the actual value of the average flow rate A of the first component per unit time t0 is smaller than the target value A0, the controller 9 controls the second flow rate controller 65c such that the actual value of the average flow rate B of the second component per unit time t0 is smaller than the target value B0. As a result, the average flow rate ratio A/B of the first component and the second component per unit time t0 matches the preset target value A0/B0. Furthermore, the error between the actual value and the target value A0/B0 of the average flow rate ratio A/B in the supply time T0 can be reduced.

In addition, when the actual value of the average flow rate A of the first component per unit time t0 is larger than the target value A0, the controller 9 controls the second flow rate controller 65c such that the actual value of the average flow rate B of the second component per unit time t0 is larger than the target value B0. As a result, the average flow rate ratio A/B of the first component and the second component per unit time t0 matches the preset target value A0/B0. Furthermore, the error between the actual value and the target value A0/B0 of the average flow rate ratio A/B in the supply time T0 can be reduced.

In the related art, the controller 9 determines that an abnormality has occurred when the instantaneous flow rate of the first component or the second component is out of a permissible range R0 (see FIGS. 6 to 8) during the ejection of the etchant to the substrate W. More specifically, when the instantaneous flow rate of the first component or the second component is out of the permissible range R0 for a predetermined time or longer, the controller 9 determines that an abnormality has occurred.

The permissible range R0 in the related art was set in consideration of fluctuations in instantaneous flow rate. The fluctuations in the instantaneous flow rate include overshoot (see the dashed line in FIG. 6), undershoot, hunting (see the dashed line in FIG. 7), or temporary drop (see the dashed line in FIG. 8). Therefore, the permissible range R0 was wide, and the fluctuation range of the total etching amount D was large.

The controller 9 of the present embodiment determines that an abnormality has occurred when the average flow rate of the first component or the second component is out of a permissible range R1 (see FIGS. 6 to 8) during the ejection of the etchant to the substrate W. By using the average flow rate instead of the instantaneous flow rate, the permissible range R1, which is smaller than that in the related art, may be adopted. Therefore, the fluctuation range of the total etching amount D can be reduced.

The permissible range R1 of the average flow rate of the first component is set based on the target value A0 of the average flow rate of the first component. For example, the permissible range R1 is set to ±1%, in other words, 99% to 101%. Here, 100% is the target value A0. The permissible range R0 of the average flow rate of the first component in the related art is set to, for example, ±15%, in other words, 85% to 115%.

The permissible range R1 of the average flow rate of the second component is set based on the target value B0 of the average flow rate of the second component. For example, the permissible range R1 is set to ±1%, in other words, 99% to 101%. Here, 100% is the target value B0. The permissible range R0 of the average flow rate of the second component in the related art is set to, for example, ±15%, in other words, 85% to 115%.

The average flow rate of the first component used for determining the abnormality is, for example, the latest average flow rate per unit time t0. The unit time t0 is twice or more and 20 times or less the measurement cycle of the first instantaneous flowmeter 64b. The measurement cycle is, for example, about 0.1 second, and the unit time t0 is, for example, about 1 second. The average flow rate of the first component used for determining the abnormality may be the average flow rate from the start of ejection of the etchant to the substrate W to the time of determination.

Similarly, the average flow rate of the second component used for determining the abnormality is, for example, the latest average flow rate per unit time to. The unit time t0 is twice or more and 20 times or less the measurement cycle of the second instantaneous flowmeter 65b. The measurement cycle is, for example, about 0.1 second, and the unit time t0 is, for example, about 1 second. The average flow rate of the second component used for determining the abnormality may be the average flow rate from the start of ejection of the etchant to the substrate W to the time of determination.

When determining that an abnormality has occurred, the controller 9 notifies the occurrence of the abnormality. A buzzer, a warning light, a display, or the like may be used for the notification. The controller 9 may interrupt the substrate process when determining that an abnormality has occurred. In addition, when determining an abnormality has occurred, the controller 9 may register in a database that the respective substrate W is a defective product.

According to an aspect of the present disclosure, it is possible to suppress fluctuations in etching amount by using an average flow rate instead of an instantaneous flow rate.

Although the embodiments of the substrate processing apparatus and the substrate processing method according to the present disclosure have been described above, the present disclosure is not limited to the above-described embodiments. Various changes, modifications, substitutions, additions, deletions, and combinations can be made within the scope of the claims. Of course, these also fall within the technical scope of the present disclosure.

What is claimed is:

1. A substrate processing apparatus comprising:
a mixer configured to mix sulfuric acid as a first component and a second component different from the first component to prepare an etchant;
a nozzle connected to the mixer and configured to eject the etchant to a substrate;
a first component supplier including a first flow path configured to supply the first component to the mixer, a first instantaneous flowmeter provided in the first flow path, and a first flow rate controller provided in the first flow path;
a second component supplier including a second flow path different from the first flow path and configured to supply the second component to the mixer, a second instantaneous flowmeter provided in the second flow path, and a second flow rate controller provided in the second flow path; and
a controller configured to control the first component supplier and the second component supplier,
wherein the controller is configured to control the first flow rate controller and the second flow rate controller and is configured to use an average flow rate of the first component and an average flow rate of the second component during the ejection of the etchant to the substrate for controlling the first flow rate controller and the second flow rate controller.

2. The substrate processing apparatus of claim 1, wherein the controller is configured to control the first flow rate controller such that the average flow rate of the first component from start of the ejection of the etchant to the substrate to end of the ejection of the etchant to the substrate matches a first preset target value during the ejection of the etchant to the substrate, and to control the second flow rate controller such that the average flow rate of the second component from the start of the ejection of the etchant to the substrate to the end of the ejection to the substrate matches a second preset target value during the ejection of the etchant to the substrate.

3. The substrate processing apparatus of claim 2, wherein the controller is configured to determine that an abnormality has occurred when the average flow rate of the first component or the average flow rate of the second component is out of a permissible range, during the ejection of the etchant to the substrate.

4. The substrate processing apparatus of claim 1, wherein the controller is configured to control the first flow rate controller and the second flow rate controller such that a ratio of the average flow rate of the first component to the average flow rate of the second component per a unit time matches a first preset target value, during the ejection of the etchant to the substrate, and
the unit time is twice or more and 20 times or less a measurement cycle of the first instantaneous flowmeter or the second instantaneous flowmeter.

5. The substrate processing apparatus of claim 4, wherein the controller is configured to determine that an abnormality has occurred when the average flow rate of the first component or the average flow rate of the second component is out of a permissible range, during the ejection of the etchant to the substrate.

6. The substrate processing apparatus of claim 1, wherein the controller is configured to determine that an abnormality has occurred when the average flow rate of the first component or the average flow rate of the second component is out of a permissible range, during the ejection of the etchant to the substrate.

7. The substrate processing apparatus of claim 6, wherein the average flow rate of the first component used for determining the abnormality is a latest average flow rate per a unit time, and
the unit time is twice or more and 20 times or less a measurement cycle of the first instantaneous flowmeter.

8. The substrate processing apparatus of claim 6, wherein the average flow rate of the first component used for determining the abnormality is an average flow rate of the first component measured from start of the ejection of the etchant to the substrate to a time of the determination.

9. The substrate processing apparatus of claim 1, wherein the second component is hydrogen peroxide water or pure water.

* * * * *